(12) United States Patent
Yu et al.

(10) Patent No.: US 6,670,260 B1
(45) Date of Patent: Dec. 30, 2003

(54) TRANSISTOR WITH LOCAL INSULATOR STRUCTURE

(75) Inventors: Bin Yu, Fremont, CA (US); Ming-Ren Lin, Cupertio, CA (US); Shekhar Pramanick, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/577,332

(22) Filed: May 24, 2000

Related U.S. Application Data

(62) Division of application No. 09/187,892, filed on Nov. 6, 1998, now Pat. No. 6,084,271.

(51) Int. Cl.$^7$ .............................................. H01L 21/425
(52) U.S. Cl. ...................... 438/526; 438/297; 438/225; 257/327; 257/647; 257/351
(58) Field of Search ................................ 257/365, 331, 257/270, 509, 647, 510, 513, 278, 396, 288, 327, 351, 328, 349; 438/297, 526, 225, 175, 174

(56) References Cited

U.S. PATENT DOCUMENTS

| | | | |
|---|---|---|---|
| 4,507,158 A | | 3/1985 | Kamins et al. |
| 4,523,213 A | * | 6/1985 | Konaka et al. |
| 4,778,775 A | | 10/1988 | Tzeng |
| 4,885,618 A | * | 12/1989 | Schubert et al. |
| 5,442,222 A | * | 8/1995 | Takasu |
| 5,463,241 A | * | 10/1995 | Kubo |
| 5,554,546 A | * | 9/1996 | Malhi |
| 5,818,092 A | | 10/1998 | Bai et al. |
| 5,930,642 A | | 7/1999 | Moore et al. |

OTHER PUBLICATIONS

Yu Bin, "Ultra–Thin–Body Silicon–on–Insulator MOSFET's for Terabit–Scale Integration", Department of Electrical Engineering & Computer Sciences, University of California Berkeley.

Auberton–Herve, "Smart–Cut®: The Basic Fabrication Process for Unibond® SOI Wafers", IEICE Trans Electron, vol. E80 C. No. 3, Mar. 1997.

Karulkar P., A Novel Technique for Fabrication of Fully Depleted CMOS Devices in Ultra–Thin SOI Films. 1989 IEEE, p. 2622.

Hobert K.D., Ultra–Cut: A Simple Technique for the Fabrication of SOI Substrates with Ultra–Thin (<5 nm) Silicon Films, 1998 IEEE, pp. 145–146.

Suzuki E. et al., 40 nm Gate Length Ultra–Thin SOI n–MOSFETs with Backside Conducting Layer. 1998 IEEE, pp. 76–77.

Wang K. et al, Scenarios of CMOS Scaling. 1998 IEEE, pp. 12–16.

* cited by examiner

*Primary Examiner*—Sheila V. Clark
(74) *Attorney, Agent, or Firm*—Foley & Lardner

(57) ABSTRACT

A thin filmed fully-depleted silicon-on-insulator (SOI) metal oxide semiconductor field defect transistor (MOSFET) utilizes a local insulation structure. The local insulative structure includes a buried silicon dioxide region under the channel region. The MOSFET body thickness is very small and yet silicon available outside of the channel region and buried silicon dioxide region is available for sufficient depths of silicide in the source and drain regions. The buried silicon dioxide region can be formed by a trench isolation technique or a LOCOS technique.

20 Claims, 11 Drawing Sheets

TRANSISTOR WITH LOCAL INSULATOR STRUCTURE

The present application is a divisional application of U.S. patent application Ser. No. 09/187,892, filed Nov. 6, 1998 U.S. Pat. No. 6,054,271 by Yu et al.

CROSS-REFERENCE TO RELATED APPLICATIONS

The present application Is related to U.S. application Ser. No. 09/187,498, now issued U.S. Pat. No. 6,380,019 entitled, "Method of Manufacturing a Transistor with a Local Insulator Structure, filed on an even date herewith by Yu, et al.

FIELD OF THE INVENTION

The present invention is related to integrated circuit (IC) devices and processes for making IC devices. More particularly, the present invention relates to an IC which includes transistors with a local buried insulator.

BACKGROUND OF THE INVENTION

Integrated circuits (ICs) include a multitude of transistors formed on a semiconductor substrate. Transistors, such as, metal oxide semiconductor field effect transistors (MOSFETs), are generally bulk semiconductor-type devices or silicon-on-insulator (SOI)-type devices.

In bulk semiconductor-type devices, transistors, such as, MOSFETs are built on the top surface of a bulk substrate. The substrate is doped to form source and drain regions, and a conductive layer is provided between the source and drain regions. The conductive layer operates as a gate for the transistor; the gate controls current in a channel between the source and the drain regions. As transistors become smaller, the body thickness of the transistor (or thickness of the depletion layer below the inversion channel) must be scaled down to achieve superior short channel performance.

According to conventional complimentary metal oxide semiconductor (CMOS) fabrication techniques, the reduction of the depletion layer thickness is realized by a super-steep retrograded well (SSRW) ion implantation process. However, this process is limited by the diffusion of dopant atoms during subsequent thermal processes (e.g., annealing). The ion implantation process can generally only achieve a 80 nanometer or larger body thickness for a transistor. Thus, conventional fabrication techniques for bulk semiconductor type-devices cannot create transistors with body thickness less than 80 nm.

Accordingly, bulk semiconductor-type devices can be subject to disadvantageous properties due to the relatively large body thicknesses. These disadvantageous properties include less than ideal sub-threshold voltage rolloff, short channel effects, and drain induced barrier layering. Further still, bulk semiconductor-type devices can be subject to further disadvantageous properties such as high junction capacitance, ineffective isolation, and low saturation current. These properties are accentuated as transistors become smaller and transistor density increases on ICs.

Conventional SOI-type devices include an insulative substrate attached to a thin film semiconductor substrate which contains transistors similar to the MOSFET described with respect to bulk semiconductor-type devices. The transistors have superior performance characteristics due to the thin film nature of the semiconductor substrate and the insulative properties of the insulative substrate. The superior performance is manifested in superior short channel performance (i.e., resistance to process variation in small size transistor), near-ideal subthreshold voltage swing (i.e., good for low off-state current leakage), and high saturation current. As transistors become smaller, the thin film semiconductor substrate also becomes thinner. The thinness of the thin film semiconductor substrate prevents effective silicidation on the thin film semiconductor substrate. Effective silicidation is necessary to form source and drain contacts. Without effective silicidation, the transistor can have large source/drain series resistances.

Typically, silicidation must consume a certain volume of the semiconductor substrate (e.g., silicon), which is not abundantly available on the thin film semiconductor substrate. The significant volume of the substrate must be consumed to appropriately make electrical contact to the source and drain regions. Accordingly, SOI-type devices are susceptible to the high series resistance which can degrade transistor saturation current and hence, the speed of the transistor. The high series resistance associated with conventional SOI CMOS technology is a major obstacle which prevents SOI technology from becoming a mainstream IC technology.

Thus, there is a need for a thin-film, fully depleted MOSFET IC which has advantages over conventional bulk type devices. Further still, there is a need for a transistor which has superior short-channel performance, near ideal subthreshold swing, and high saturation current and yet is not susceptible to high series resistance. Even further still, there is a need for a thin film transistor which has sufficient silicon for effective silicidation.

SUMMARY OF THE INVENTION

The present invention relates to an integrated circuit including a first wafer layer and a second wafer layer. The first wafer layer includes a plurality of insulator regions disposed on a first semiconductor substrate. The second wafer layer is disposed above the first wafer layer and includes a plurality of transistors disposed in a second semiconductor substrate. Each of the transistors includes a gate disposed between a source region and a drain region. Each of the transistors is disposed above a respective insulator region of the insulator regions.

The present invention further relates to an ultra-large scale integrated (ULSI) circuit including a plurality of field effect transistors. The transistors include a gate disposed above a channel region. The channel region is between a source region and a drain region. The channel region is located on a first substrate above a local insulator means for reducing transient enhanced diffusion on a second substrate.

The present invention even further still relates to a ULSI circuit including a plurality of transistors. Each transistor has a local insulator region. The integrated circuit is manufactured by steps including forming a plurality of insulator regions on a top surface of a first semiconductor substrate, attaching a bottom surface of a second semiconductor substrate to the top surface, and forming a plurality of gate structures on the second semiconductor substrate. The gate structures are located above respective insulator regions of the regions.

BRIEF DESCRIPTION OF THE DRAWINGS

Exemplary embodiments of the present invention will be described below with reference to the accompanying drawings, wherein like numerals denote like elements, and.

DETAILED DESCRIPTION OF THE PREFERRED EXEMPLARY EMBODIMENTS

Figure 1:
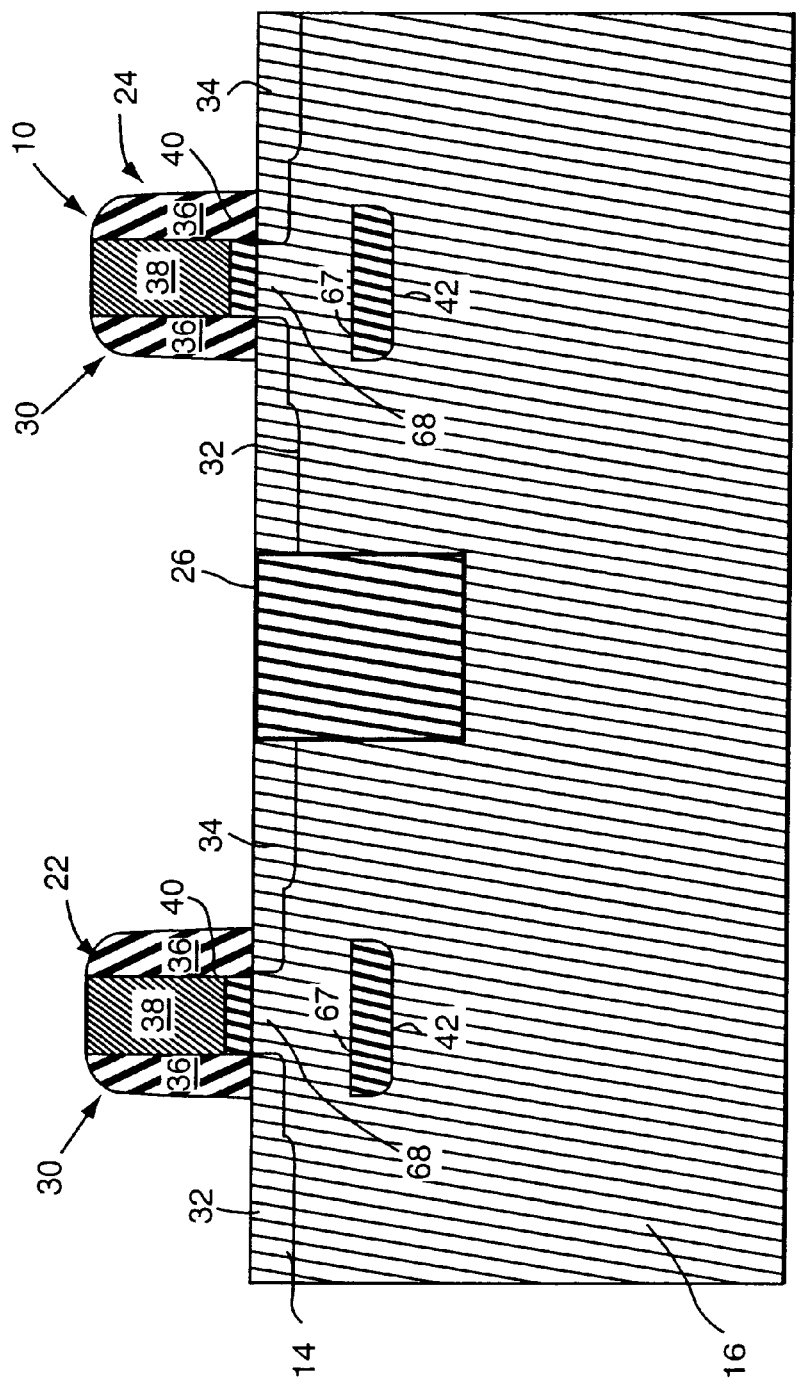
FIG. 1 is a cross-sectional view of a portion of an integrated circuit in accordance with an exemplary embodiment of the present invention, the integrated circuit is disposed on a compound wafer comprised of a first wafer and a second wafer.

With reference to FIG. 1, a portion 10 of an integrated circuit (IC) is provided on a compound wafer 16. Compound wafer 16 is comprised of a wafer 12 and a wafer 14. Wafers 12 and 14 can be semiconductor wafers, such as, silicon wafers. The IC associated with portion 10 is preferably an ultra-large scale integrated (ULSI) circuit having ultra-thin body transistors with gate critical dimensions less than 80 nm. The transistors are high speed and packed at high density on the IC.

Portion 10 includes a transistor 22 and a transistor 24 separated by an isolation structure 26. Structure 26 is preferably an isolation trench formed by etching a recess and depositing silicon dioxide in the recess. The silicon dioxide can be deposited in a tetraorthosilicate (TEOS) process. Transistors 22 and 24 can be N-channel or P-channel metal oxide semiconductor field effect transistors (MOSFETs). Structure 26 can be formed in a conventional shallow trench isolation (STI) process.

Transistors 22 and 24 are preferably thin film, fully depleted MOSFETs. Transistors 22 and 24 each include a gate structure 30, a source region 32 and a drain region 34. Gate structure 30 includes sidewall spacers 36, a polysilicon conductive line 38, and a dielectric layer 40. Dielectric layer 40 is preferably a gate oxide, such as, thermally grown silicon dioxide.

Transistors 22 and 24 advantageously each include a buried isolation structure 42 beneath the channel between drain region 34 and source region 32. Structure 42 is located in accordance with its respective gate structure 30. Structures 42 are preferably a buried insulative material, such as, a silicon dioxide locally positioned below the channel of transistors 22 and 24. Because structures 42 are only located beneath the channel of transistors 22 and 24, the depth of source regions 32 and drain regions 34 are not affected by the placement of structures 42. Therefore, silicidation for connections to regions 32 and 34 can penetrate deeply within wafer 12.

Transistors 22 and 24 have an ultra-thin body (e.g., less than 80 nm) and have all the advantages associated with thin-film, fully-depleted SOI-type devices. The body thickness is controlled through wafer 14 as described in more detail below. Structures 42 reduce transient-enhanced diffusion (TED effect) by terminating the diffusion path between source region 32 and drain regions 34. Also, the channel characteristics associated with transistors 22 and 24 can be designed to have a low doping concentration to improve the channel carrier mobility as needed. Improved channel carrier mobility increases drive current and speed of transistors 22 and 24.

Further, transistors 22 and 24 have superior immunity to short channel effects without any channel doping engineering. The channel doping concentration can also be designed to be uniformly distributed in the vertical direction. Concentration is not impacted by subsequent thermal annealing processes and is therefore independent of the total process thermal budget.

Figure 2:
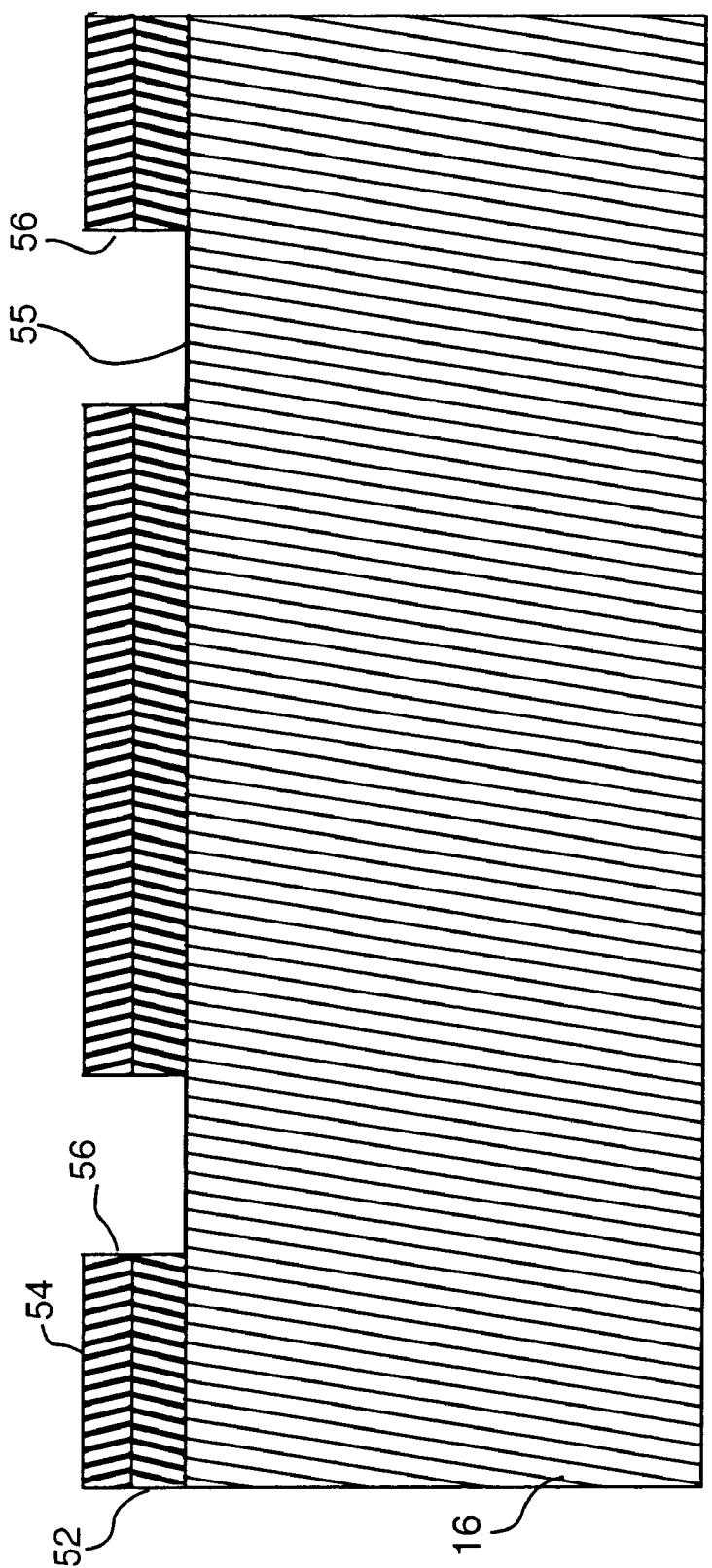
FIG. 2 is a cross-sectional view of the portion of the IC illustrated in FIG. 1, showing a photolithographic patterning step on the first wafer.

With reference to FIGS. 1 . 5 the fabrication of transistors 22 and 24 of portion 10 are described below as follows. In FIG. 2, wafer 16 includes a thermally grown silicon dioxide layer 52 and a silicon nitride ($Si_3N_4$) layer 54 (e.g., an oxide/nitride stack on a top surface 55). Layers 52 and 54 are patterned via a photolithographic technique to provide apertures 56 corresponding to structures 42 (FIG. 1). Layer 54 is deposited by chemical vapor deposition (CVD) and is 50–60 nanometers (nm) thick. Layer 52 is 20–30 nm thick.

Figure 3:
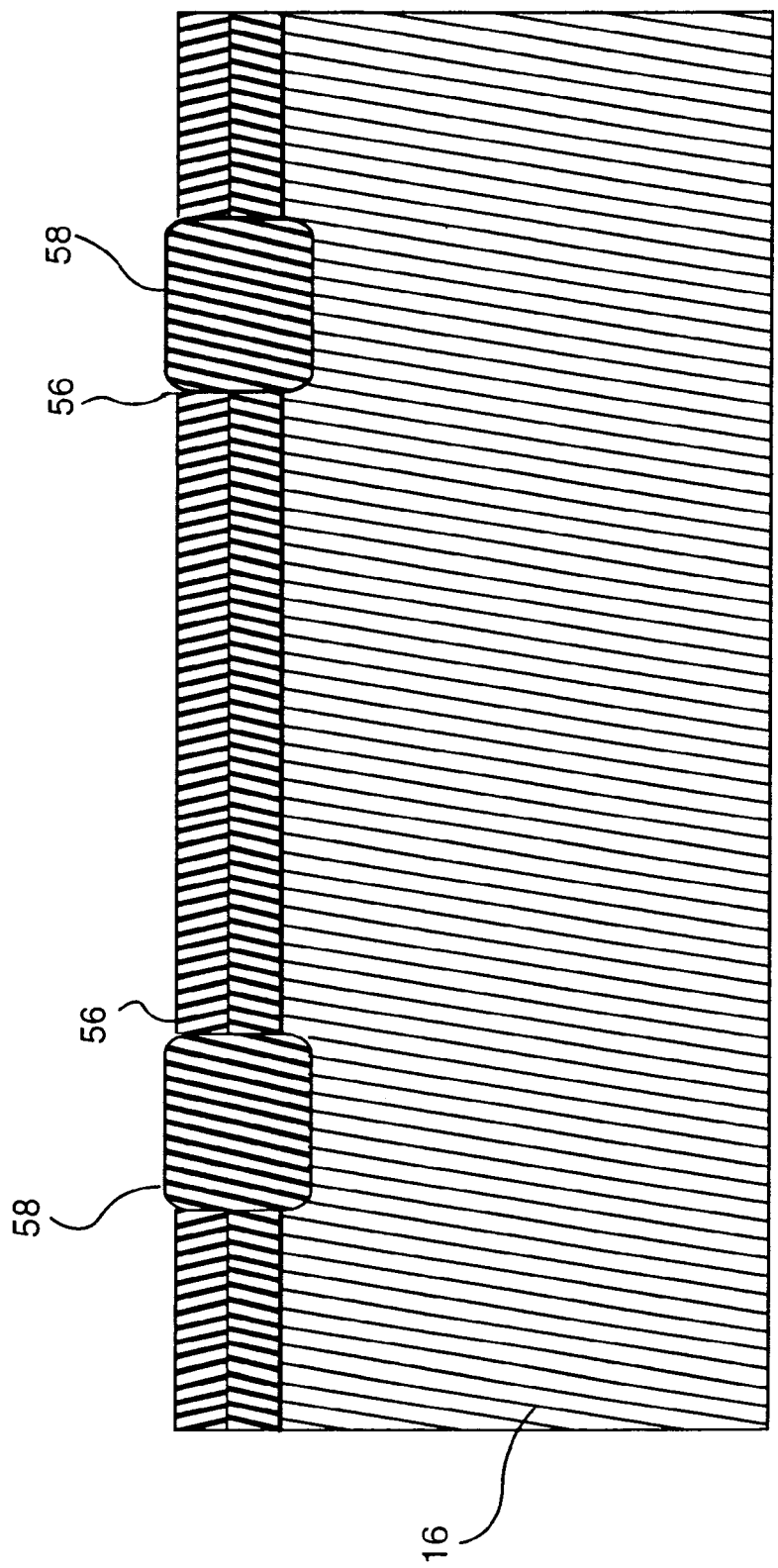
FIG. 3 is a cross-sectional view of the portion of the IC illustrated in FIG. 1, showing an oxidation step on the first wafer.

In FIG. 3, wafer 16 is subjected to a local oxidation of silicon (LOCOS) process wherein LOCOS structures 58 are grown in apertures 56. LOCOS structures 58 preferably have a thickness between 60 nm and 80 nm. Structures 58 are modified (as described below with reference to FIG. 4) to form buried isolation structures 42 (FIG. 1). Structures 58 (which are the basis for structures 42 in FIG. 1) are formed in a thermal oxidation step when wafer 16 is separate from wafer 14 so transistors 22 and 24 are not affected by the thermal nature of the thermal oxidation step. The width of aperture 56 is preferably less than 80 nm and the width of structure 58 is slightly more than 80 nm.

Figure 4:
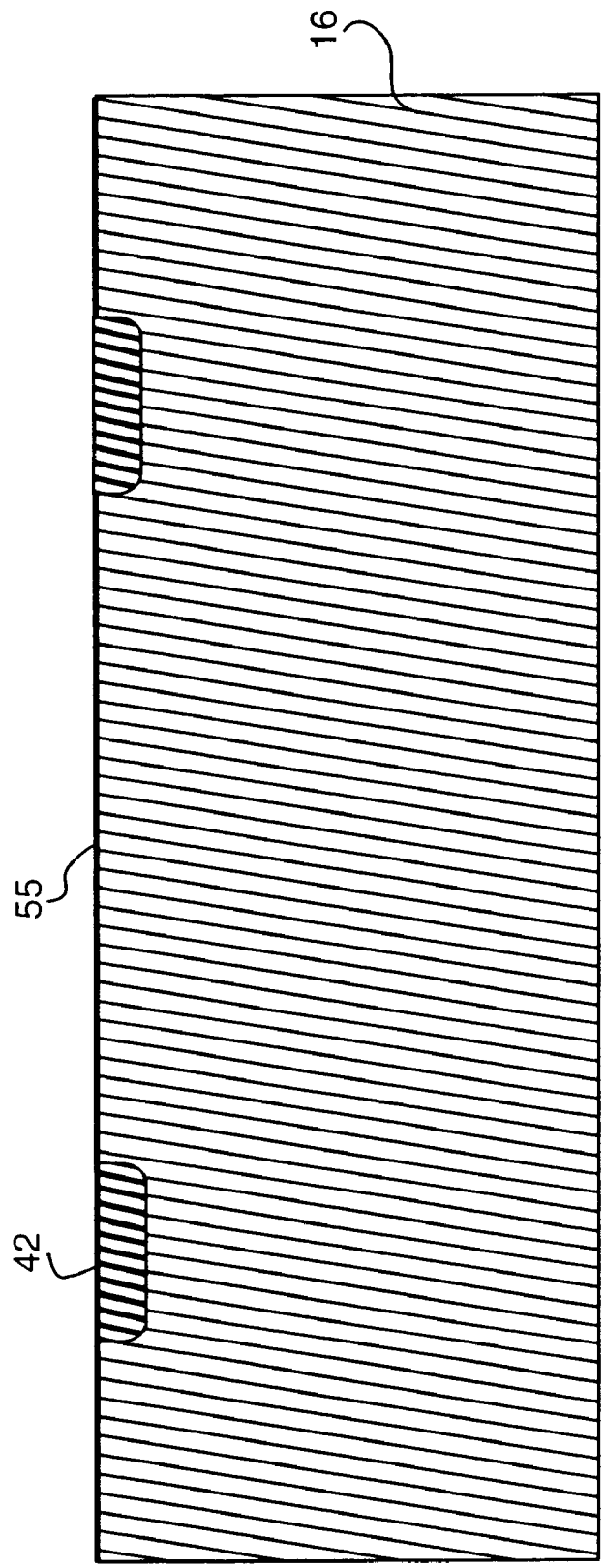
FIG. 4 is a cross-sectional view of the portion of the IC illustrated in FIG. 1, showing a chemical-mechanical polish (CMP) step on the first wafer.

With reference to FIG. 4, wafer 16 is subjected to a chemical-mechanical polish (CMP) to remove layers 52 and 54 and a portion of structure 58 to form structure 42. The CMP process removes structures 58 above surface 55. Preferably, structure 42 has a thickness of between 30 and 40 nm and a width of less than 80 nanometers. The thickness of wafer 16 and structure 42 can be precisely controlled by the CMP process.

Figure 5:
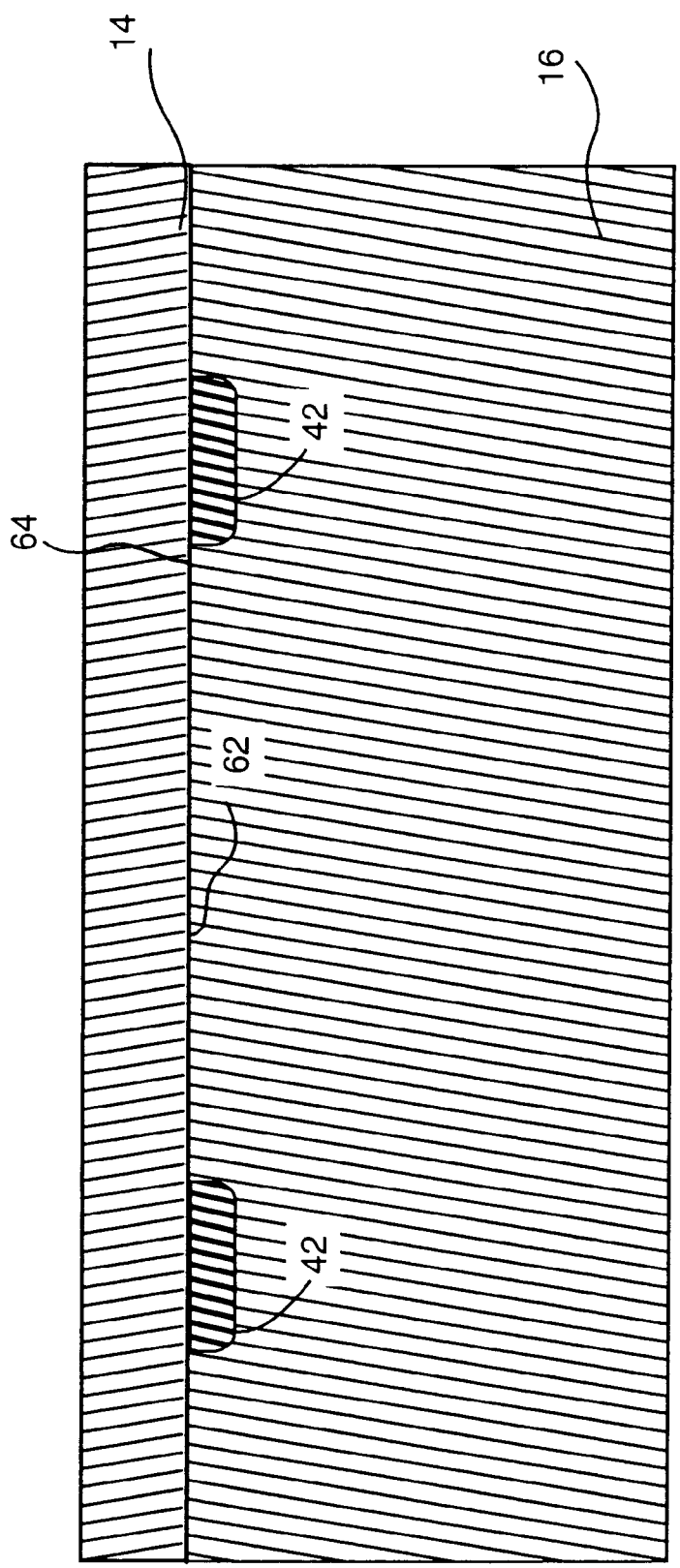
FIG. 5 is a cross-sectional view of the portion of the IC illustrated in FIG. 1, showing the bonding step of the first wafer to the second wafer.

With reference to FIG. 5, wafer 14 is bonded with wafer 16. A top surface 62 of wafer 16 is attached to a bottom surface 64 of wafer 14. Wafer 14 is preferably a silicon wafer having a thickness of approximately 100 nm or less. The thickness of wafer 14 can be precisely configured by a CMP process and in such a way, transistors 22 and 24 can be thin filmed fully depleted MOSFETs.

Wafer 16 can be attached to wafer 14 by a number of processes. Preferably, wafer 14 is attached to wafer 16 by a hydrogen-based process, such as, the hydrogen-based process described in "Smart-cut®: The Basic Fabrication Process for Unibond® SOI Wafers," IEICE Transactions on Electronics, March 1997, volume E80-C, (No. 3): 358 63 by Augberton-Herve et al. According to such a process, surfaces 62 and 64 are cleaned by a buffered hydrogen fluorine (HF) dip so surfaces 62 and 64 are hydrogen terminated. Wafers 14 and 16 are heated and pressed together (e.g., bonded) to form compound wafer 12 (FIG. 1).

With reference to FIG. 1, a distance between a top 67 of structures 42 and a bottom 68 of layer 40 is approximately 100 nm or less. After wafers 14 and 16 are bonded, conventional transistor fabrication flow can be utilized to form structure 26, gate structures 30, source regions 32 and drain regions 34. Conventional processes can be utilized to form contacts, metals, interconnects and other structures to complete the fabrication of transistors 22 and 24 and IC 10. The availability of silicon on wafer 16 below source regions 32 and drain regions 34 allow significant body thicknesses for appropriate silicidation, thereby ensuring low drain/source region series resistance. Wafer 16 provides the significant body thickness, while structures 42 maintain the thin film nature of the operation of transistors 22 and 24.

Figure 6:
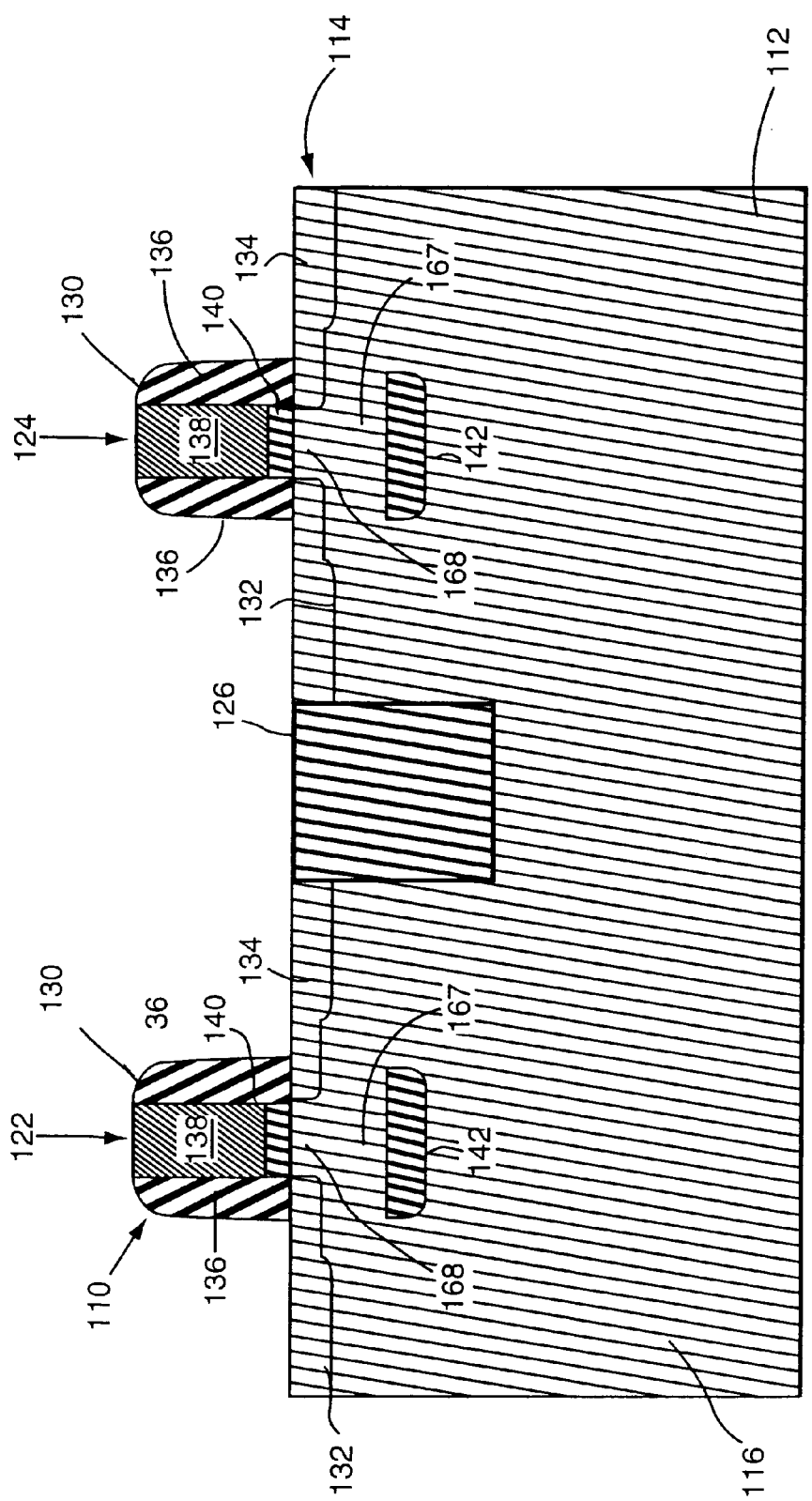
FIG. 6 is a cross-sectional view of a portion of an integrated circuit in accordance with another exemplary embodiment of the present invention, the integrated circuit is disposed on a compound wafer comprised of a first wafer and a second wafer.

With reference to FIG. 6, a portion 110 of an IC is similar to portion 10 described with reference to FIGS. 1–5. Portion 110 is provided on a compound wafer 116 which is comprised of a wafer 112 and a wafer 114. Wafers 112 and wafers 114 can be semiconductor wafers, such as, silicon wafers. The IC associated with portion 110 is preferably a ULSI circuit having ultra thin transistors with gate critical dimensions less than 80 nm.

Portion 110 includes a transistor 122 and a transistor 124 separated by an isolation structure 126. Structure 126 is preferably an isolation trench formed by etching a recess and depositing silicon dioxide in the recess in an STI process. The silicon dioxide can be provided by physical or chemical vapor deposition. The silicon dioxide is selectivity etched to leave the silicon dioxide in the trench.

Transistors 122 and 124 can be N-channel or P-channel MOSFETs and can be similar to transistors 22 and 24 (FIG. 1). Transistors 122 and 124 are preferably thin film, fully depleted MOSFETs. Transistors 122 and 124 each include a gate structure 130, a source region 132 and a drain region 134. Gate structure 130 includes side wall spacers 136, a polysilicon conductive line 138, and a dielectric layer 140. Dielectric layer 140 is preferably a gate oxide, such as, thermally grown silicon dioxide.

Transistors 122 and 124 advantageously include a buried isolation structure 142 beneath the channel between source region 132 and drain region 134. Structure 142 is located in accordance with its respective gate structure 130. Structures 142 are preferably a buried insulative material, such as, a silicon dioxide region. Structures 142 are positioned below the channel of transistors 122 and 124. Because structures 142 are only located beneath the channel of structures 122 and 124, the depth of source regions 132 and drain region 134 are not affected by the placement of structures 142. Therefore, silicidation for connections to regions 132 and 134 can penetrate deeply within wafer 112.

Transistors 122 and 124 have an ultra-thin body (e.g., less than 80 nanometers (nm)) and have all of the advantageous associated with thin-film, fully-depleted SOI-type devices. The body thickness of transistors 122 and 124 is controlled through wafer 114 as described in more detail below. Structures 142 reduce transient enhanced diffusion (TED effect) by terminating the diffusion path between source region 132 and drain region 134. Also, the channel characteristics associated with transistors 122 and 124 can be designed to have a low doping concentration to improve the channel courier mobility as needed. Improved channel carrier mobility increases the drive current and speed of transistors 122 and 124.

Further transistors 122 and 124 have superior immunity to short channel effects without any channel doping engineering. The channel doping concentration can also be designed to be uniformly distributed in the vertical direction. Concentration is not impacted by subsequent thermal annealing processes and is therefore, independent of the total process thermal budget.

Figure 7:
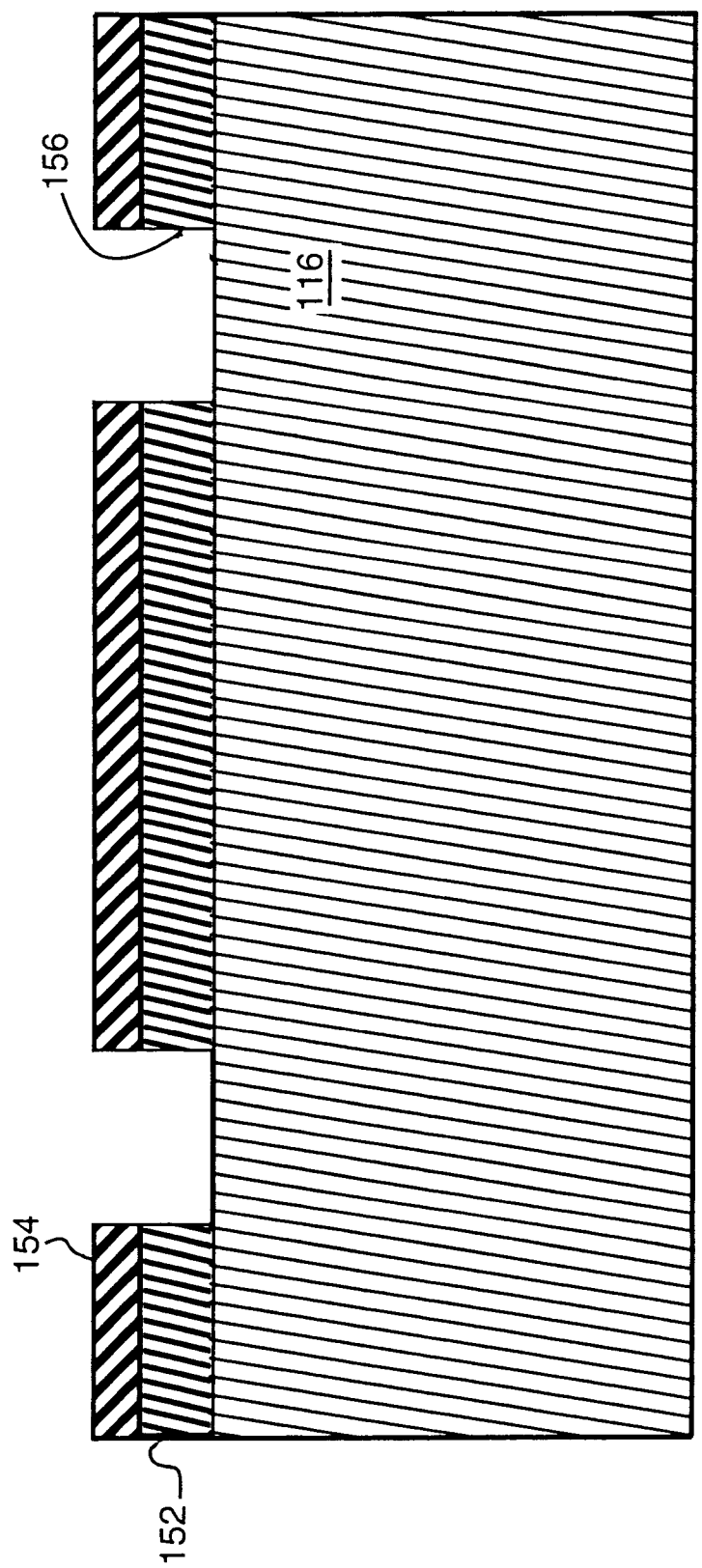
FIG. 7 is a cross-sectional view of the portion of the IC illustrated in FIG. 6, showing a photolithographic patterning step on the first wafer.

With reference to FIGS. 6–11, the fabrication of transistors 122 and 124 of portion 110 are described below as follows. In FIG. 7, wafer 116 includes a thermally grown silicon dioxide layer 152 and a silicon nitride layer 154. Layers 152 and 154 are patterned with a photolithographic technique to provide apertures 156 corresponding to structures 142, (FIG. 6). Layer 154 is deposited by CVD and is 50–60 nm thick. Layer 52 is 20–30 nm thick.

Figure 8:
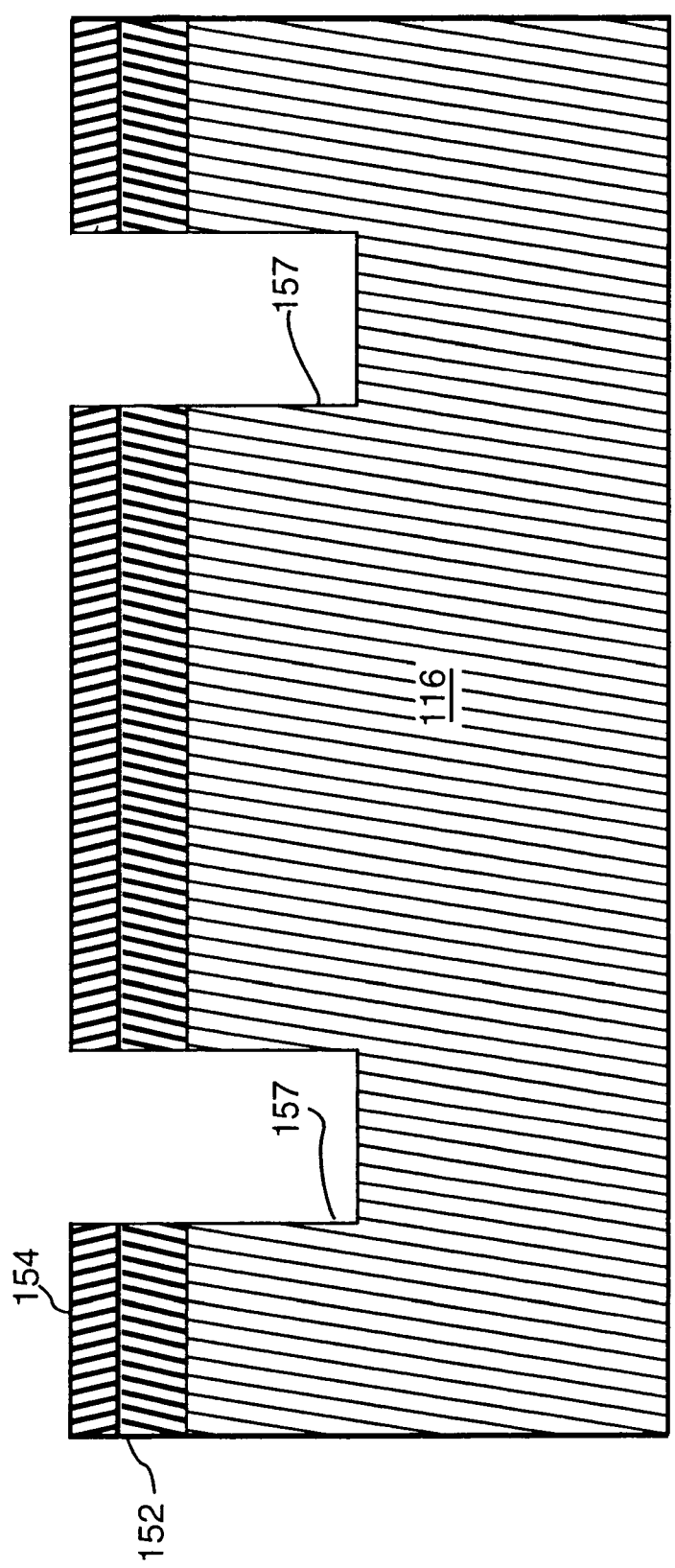
FIG. 8 is a cross-sectional view of the portion of the IC illustrated in FIG. 1, showing a shallow trench etching step on the first wafer.

In FIG. 8, wafer 16 is etched in accordance with apertures 156 to form trenches 157. Preferably, trenches 157 are 60–200 nm deep. Trenches 157 are preferably formed in a plasma etching process. The width of trenches 157 is preferably between 100 and 150 nm. Trenches 157 are preferably shallow isolation trenches which can be formed in a conventional shallow trench isolation (STI) process.

Figure 9:
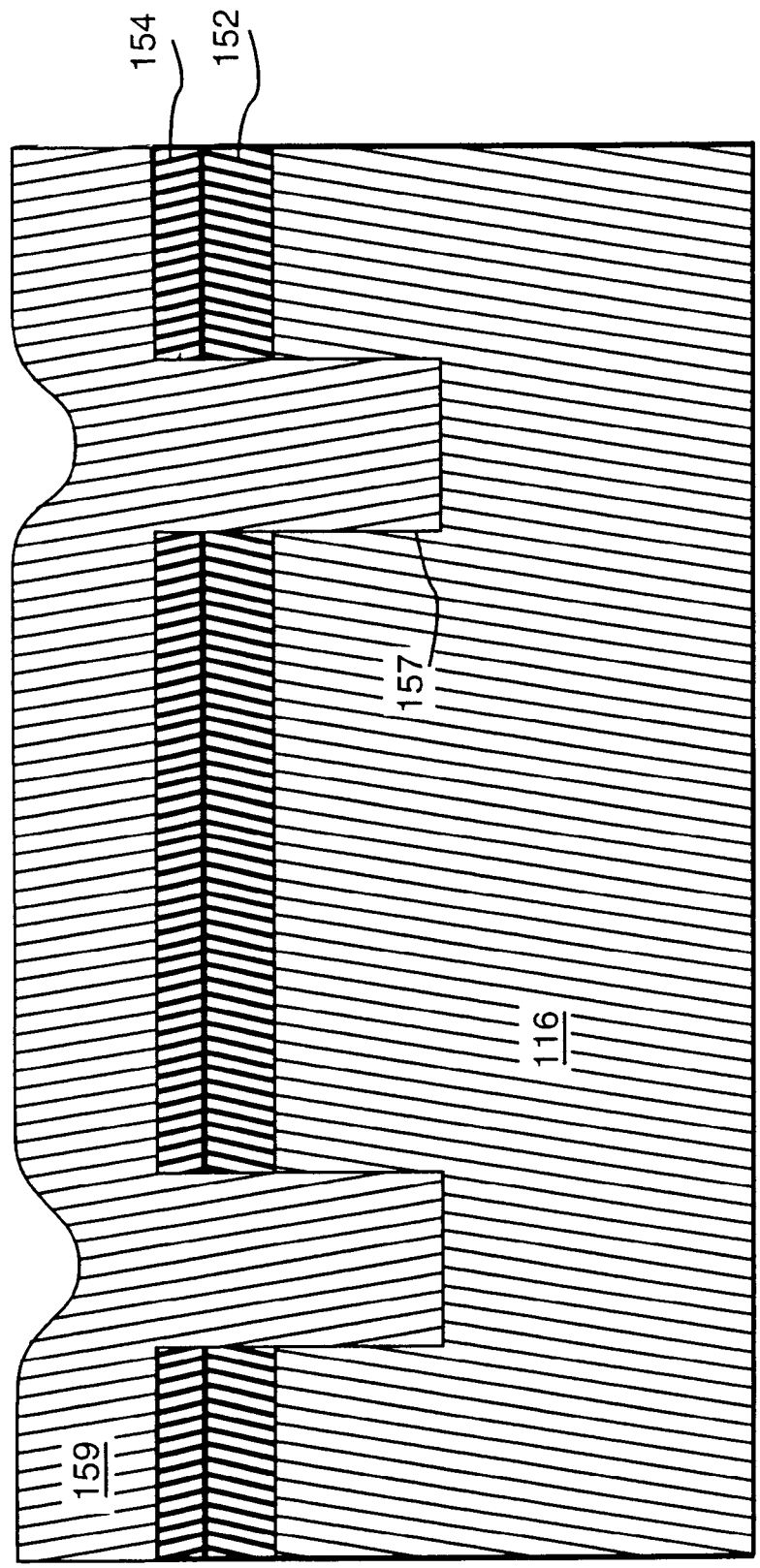
FIG. 9 is a cross-sectional view of the portion of the IC illustrated in FIG. 1, showing an oxide deposition step on the first wafer.
Figure 10:
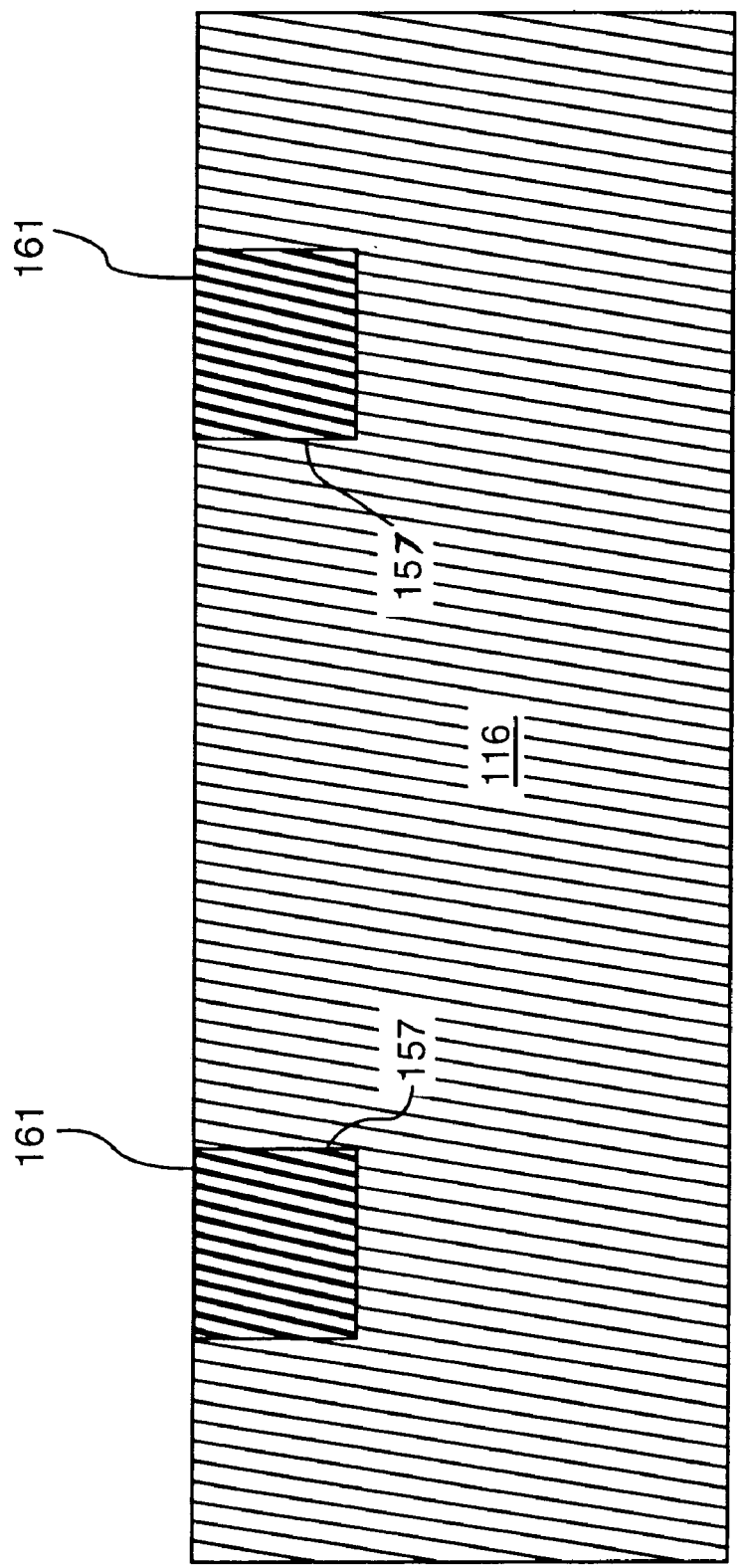
FIG. 10 is a cross-sectional view of the portion of the IC illustrated in FIG. 1, showing a chemical-mechanical polish (CMP) step on the first wafer.

With reference to FIG. 9, trenches 157 and layer 154 are coated with an insulative material, such as silicon dioxide. Preferably, the silicon dioxide is provided as part of a silicon dioxide layer 159 which is conformally deposited in a TEOS process. In FIG. 10, layers 152, 154 and 159 are stripped from wafer 116. Preferably, layers 152, 154 and 159 are removed in a CMP process. The CMP process allows to remain silicon dioxide structures 161 in trenches 157 (structures 161 eventually become structures 142 discussed with reference to FIG. 6).

Figure 11:
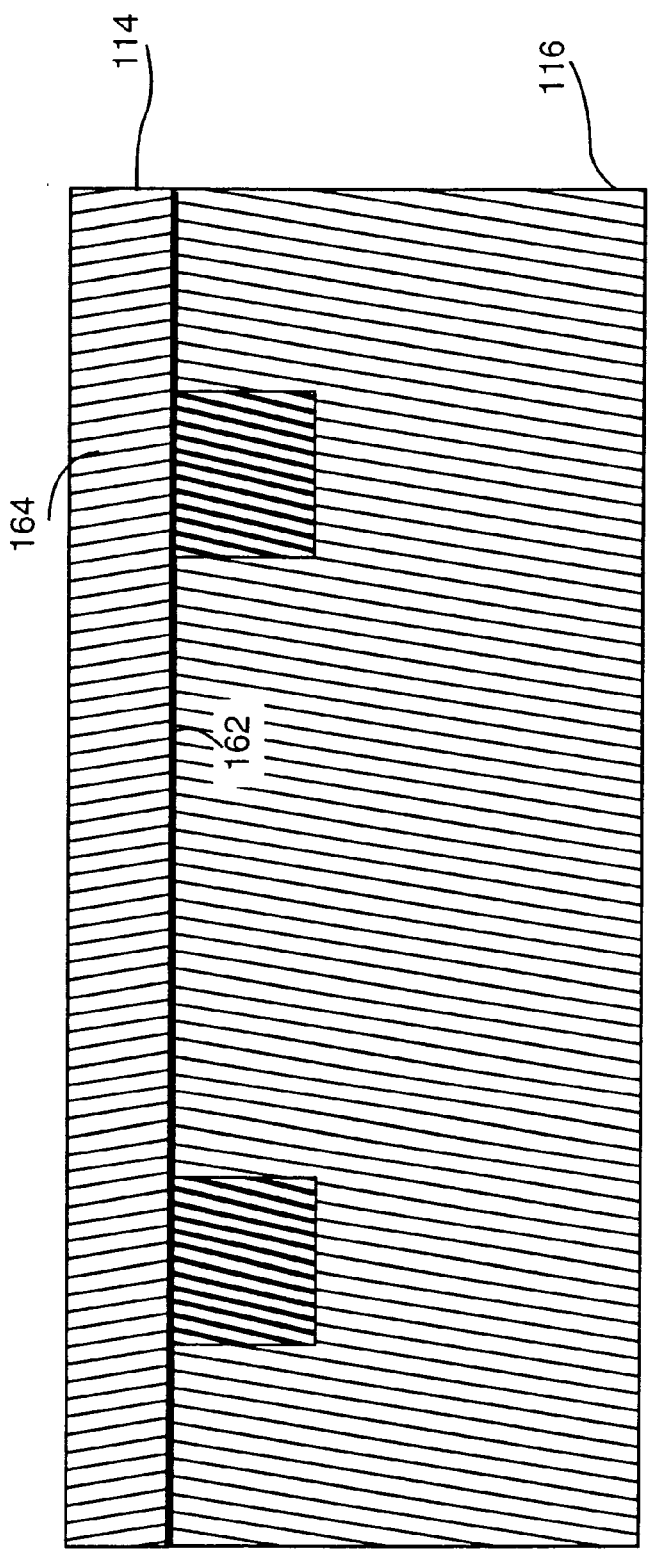
FIG. 11 is a cross-sectional view of the portion of the IC illustrated in FIG. 1, showing the bonding step of the first wafer to the second wafer.

With reference to FIG. 11, wafer 114 is bonded with wafer 116. A top surface 162 of wafer 116 is attached to a bottom surface 164 of wafer 114. Wafer 114 is preferably a silicon wafer having a thickness of approximately 100 nm or less. The thickness of wafer 114 can be precisely configured by a CMP process, and, in such a way, transistors 122 and 124 can be thin film, fully depleted MOSFETs.

Wafer 116 can be attached to wafer 114 by a number of processes. Preferably, wafer 114 is attached to wafer 116 by a hydrogen-based process, such as, the hydrogen-based process described in "Smart-Cut®: the basic fabrication process for Unibond® SAI wafers," i.e., ICE transactions on electronics, March 1997, Volume E-80-C, (No. 3): 358-63 by Augberton-Herve et al. According to such a process, surfaces 162 and 164 are created by a buffered hydrogen fluorine (HF) dip so surfaces 162 and 164 are hydrogen terminated. Wafers 114 and 116 are heated and pressed together to form compound wafer 112 (FIG. 6).

With reference to FIG. 6, a distance between a top 167 of structures 142 and a bottom 168 of layer 140 is approximately 100 nm or less. Preferably, the distance is between 40 and 100 nm under proper process control. Therefore, transistors 122 and 124 possess superior immunity to short channeling effects and achieve near ideal threshold voltage swings and drain-induced barrier lowering.

After wafers 114 and 116 are bonded, conventional fabrication flow can be utilized to form structure 126, gate structures 130, source regions 132 and drain regions 134.

Conventional processes can be utilized to form contacts, metals, interconnects and other structures to complete the fabrication of transistors 22 and 24 and IC 110. The availability of silicon on wafer 116 below source regions 132 and drain regions 134 allow significant body thickness for appropriate silicidation, thereby assuring low drain/source region series resistance. Wafer 116 provides the significant body thickness, while structures 142 maintain the thin film nature of the operation of transistors 122 and 124.

It is understood that, while the detailed drawings of specific examples describe exemplary embodiments of the present invention, they are for the purpose of illustration only. The apparatus and method of the invention is not limited to the precise details, geometries, dimensions, materials and conditions disclosed. For example, although particular layers and dimensions are described, other materials and sizes can be utilized. Various changes can be made to the precise details disclosed without departing from the spirit of the invention which is defined by the following claims.

What is claimed is:

1. An ultra-large scale integrated circuit including a plurality of transistors, each transistor of the transistors having a local insulator region, the integrated circuit being manufactured by steps comprising:

forming a plurality of local insulator regions on a top surface of a first semiconductor substrate;

a attaching a bottom surface of a second semiconductor substrate to the top surface, wherein the first semiconductor substrate and the second semiconductor substrate are attached according to a hydrogen-based process; and forming a plurality of gate structures an the second semiconductor substrate, the gate structures being located above respective insulator regions of the local insulator regions, a wherein a thickness between the respective insulator regions and the gate structures is less than 80 nm.

2. An ultra-large scale integrated circuit including a plurality of transistors, each transistor of the transistors having a local insulator region, the integrated circuit being manufactured by steps comprising:

forming a plurality of local insulator regions on a top surface of a first semiconductor substrate;

attaching a bottom surface of a second semiconductor substrate to the top surface; and a forming a plurality of gate structures on the second semiconductor substrate, the gate structures being located above respective insulator regions of the local insulator regions, wherein a thickness between the respective insulator regions and the gate structures is less than 80 nm.

3. The integrated circuit of claim 2, wherein the transistors are metal oxide semiconductor field effect transistors.

4. The integrated circuit of claim 2, wherein the thickness between the respective insulator regions and the gate structures is less than 50 nm.

5. An ultra-large scale integrated circuit including a plurality of transistors, each transistor of the transistors having a local insulator region, the integrated circuit being manufactured by steps comprising:

forming a plurality of local insulator regions on a top surface of a first semiconductor wafer;

attaching a bottom surface of a second semiconductor wafer to the top surface; and forming a plurality of gate structures on the second semiconductor wafer, the gate structures being located above respective insulator regions of the local insulator regions, wherein the first wafer and the second wafer are attached through a hydrogen-based process, wherein a thickness between the respective insulator regions and the gate structures is less than 80 nm so that the transistors have a body thickness of less than 80 nm.

6. An ultra-large scale integrated circuit including a plurality of transistors, each transistor of the transistors having a local insulator region, the integrated circuit being manufactured by steps comprising:

forming a plurality of local insulator regions on a top surface of a first semiconductor substrate;

attaching a bottom surface of a second semiconductor substrate to the top surface; and forming a plurality of gate structures on the second semiconductor substrate, the gate structures being located above respective insulator regions of the local insulator regions, wherein the local insulator regions reduce thickness of a depletion layer, wherein a thickness between the respective insulator regions and the gate structures is less than 80 nm.

7. An integrated circuit including transistors having channel regions less than 80 nm thick, the integrated circuit being manufactured by:

providing a plurality of insulator structures an a first semiconductor substrate, the first semiconductor substrate having a top surface;

attaching a bottom surface of a second semiconductor substrate to the top surface; and forming a plurality of gate structures on the second semiconductor substrate, a respective gate structure of the gate structures being located above a respective insulator structure of the insulator structures, whereby a thickness between the respective insulator structure and the respective gate structure is less than 80 nm.

8. The integrated circuit of claim 7, wherein the insulator structures include silicon dioxide.

9. The integrated circuit of claim 8, wherein the silicon dioxide is formed in a locos process.

10. The integrated circuit of claim 7, wherein the silicon dioxide is formed in a trench process.

11. The integrated circuit of claim 10, wherein the trench process includes etching a plurality of trenches in the first substrate, depositing a conformal silicon dioxide layer, and selectively etching the silicon dioxide layer to leave the silicon dioxide in the trenches.

12. The integrated circuit of claim 7, wherein the attaching step is a hydrogen-based process.

13. The integrated circuit of claim 7, wherein the thickness between the respective insulator structure and the respective gate structure is less than 50 nm.

14. The integrated circuit of claim 7, wherein the thickness between the respective insulator structure and the respective gate structure is equal to 50 nm.

15. The integrated circuit of claim 7, wherein the insulator structures are at least 40 nm thick.

16. An integrated circuit including field effect transistors, the field effect transistors each including a gate disposed above a channel region, the channel region being between a source region and a drain region, the integrated circuit being manufactured by a method comprising steps of:

providing a photoresist pattern above a first surface of a first semiconductor substrate, the pattern defining a plurality of openings;

forming a plurality of insulator regions at locations associated with the openings;

attaching a second surface of a second semiconductor substrate to the first surface of the first semiconductor substrate; and providing a plurality of gate structures on the second semiconductor substrate, a respective gate structure of the gate structures being located above a respective insulator region of the insulator regions, whereby a thickness between the respective gate structure and the respective insulator region is less than 80 nm.

17. The method of claim 16, wherein the insulator regions include silicon dioxide.

18. The method of claim 17, wherein the insulator regions are less than 100 nm from a third surface opposite the second surface of the second semiconductor substrate.

19. The method of claim 17, wherein the silicon dioxide is formed in a locos process.

20. The method of claim 17, wherein the silicon dioxide is formed in a shallow trench isolation process.

* * * * *

UNITED STATES PATENT AND TRADEMARK OFFICE
CERTIFICATE OF CORRECTION

PATENT NO.    : 6,670,260 B1
DATED         : December 30, 2003
INVENTOR(S)   : Bin Yu, Ming-Ren Lin and Shekhar Pramanick It is certified that error appears in the above-identified patent and that said Letters Patent is hereby corrected as shown below:

Column 7,
Lines 27, 36 and 46, delete "a" first appearance.

Column 8,
Line 25, delete "an" and replace it with -- on --.

Signed and Sealed this

Twenty-ninth Day of June, 2004

JON W. DUDAS
*Acting Director of the United States Patent and Trademark Office*